(12) United States Patent
Cui

(10) Patent No.: US 9,257,270 B2
(45) Date of Patent: Feb. 9, 2016

(54) METHOD AND COMPOSITION FOR REMOVING RESIST, ETCH RESIDUE, AND COPPER OXIDE FROM SUBSTRATES HAVING COPPER, METAL HARDMASK AND LOW-K DIELECTRIC MATERIAL

(71) Applicant: EKC Technology, Inc., Hayward, CA (US)

(72) Inventor: Hua Cui, Castro Valley, CA (US)

(73) Assignee: EKC TECHNOLOGY

( * ) Notice: Subject to any disclaimer, the term of this patent is extended or adjusted under 35 U.S.C. 154(b) by 144 days.

(21) Appl. No.: 13/765,480

(22) Filed: Feb. 12, 2013

(65) Prior Publication Data

US 2013/0157472 A1      Jun. 20, 2013

Related U.S. Application Data

(63) Continuation-in-part of application No. 13/209,859, filed on Aug. 15, 2011, now abandoned.

(51) Int. Cl.
| | |
|---|---|
| *H01L 21/02* | (2006.01) |
| *C09K 13/00* | (2006.01) |
| *C11D 3/00* | (2006.01) |
| *C11D 3/39* | (2006.01) |
| *C11D 3/395* | (2006.01) |
| *C11D 7/32* | (2006.01) |
| *C11D 11/00* | (2006.01) |

(52) U.S. Cl.
CPC ............ *H01L 21/0206* (2013.01); *C09K 13/00* (2013.01); *C11D 3/0073* (2013.01); *C11D 3/3947* (2013.01); *C11D 3/3956* (2013.01); *C11D 7/3281* (2013.01); *C11D 11/0047* (2013.01)

(58) Field of Classification Search
CPC ..................................................... C11D 11/0047
See application file for complete search history.

(56) References Cited

U.S. PATENT DOCUMENTS

| | | | | |
|---|---|---|---|---|
| 5,466,389 | A * | 11/1995 | Ilardi et al. | 510/175 |
| 6,546,939 | B1 * | 4/2003 | Small | 134/1.3 |
| 8,057,696 | B2 * | 11/2011 | Chelle et al. | 252/79.1 |
| 2005/0176603 | A1 * | 8/2005 | Hsu | 510/175 |
| 2008/0261847 | A1 * | 10/2008 | Visintin et al. | 510/176 |
| 2009/0120458 | A1 * | 5/2009 | Hao | 134/2 |
| 2009/0215658 | A1 * | 8/2009 | Minsek et al. | 510/175 |

* cited by examiner

*Primary Examiner* — Gregory Webb
(74) *Attorney, Agent, or Firm* — Simon L. Xu

(57) ABSTRACT

A semiconductor processing composition and method for removing photoresist, polymeric materials, etching residues and copper oxide from a substrate comprising copper, low-k dielectric material and TiN, TiNxOy or W wherein the composition includes water, at least one halide anion selected from Cl⁻ or Br⁻, and, where the metal hard mask comprises only TiN or TiNxOy, optionally at least one hydroxide source.

6 Claims, 17 Drawing Sheets

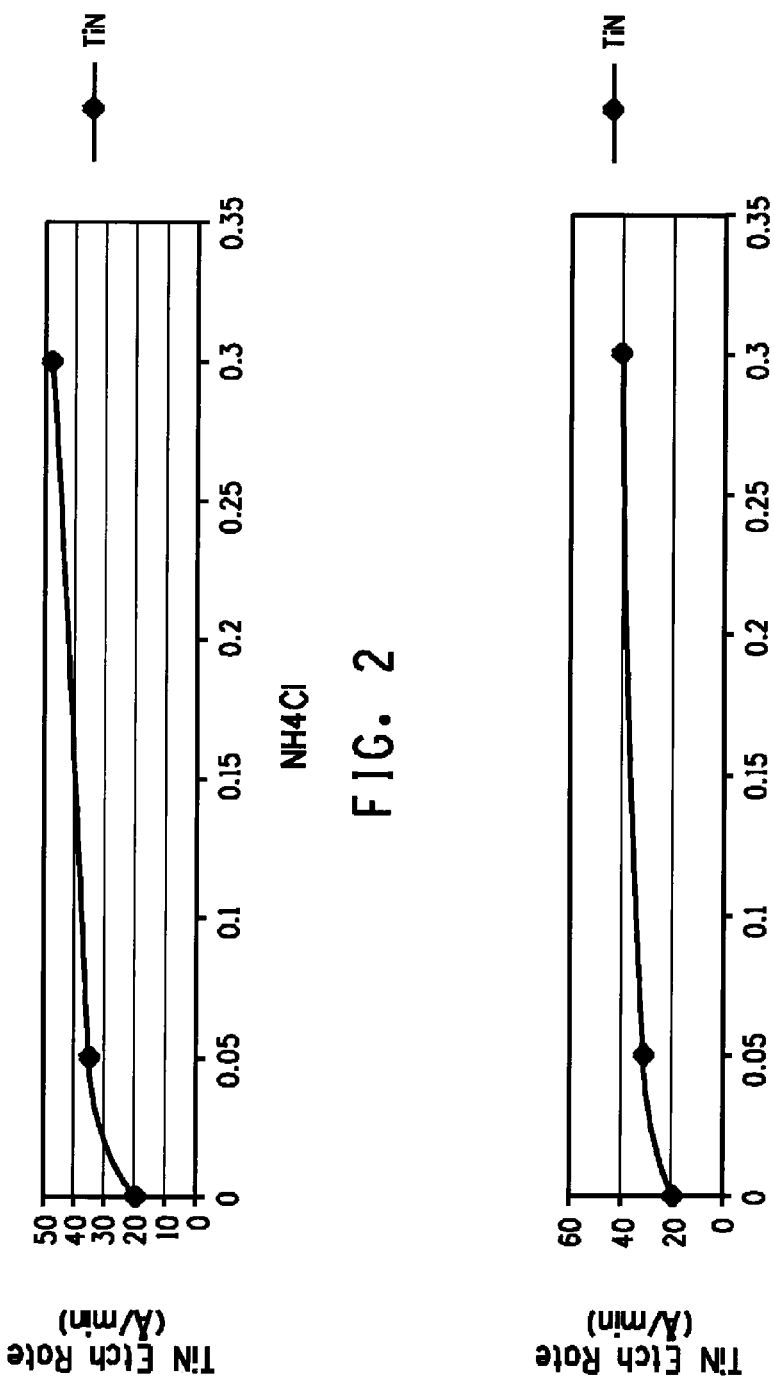

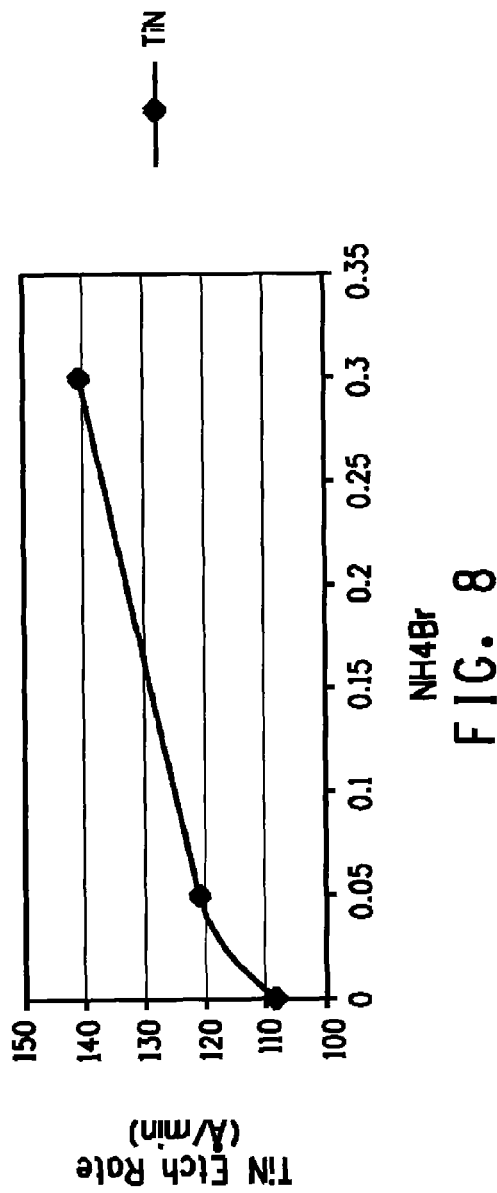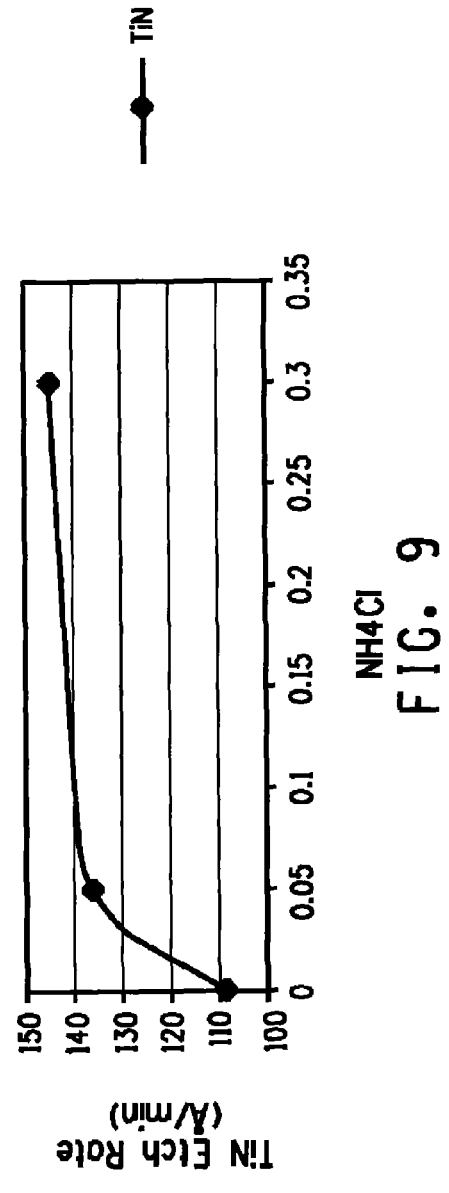

METHOD AND COMPOSITION FOR REMOVING RESIST, ETCH RESIDUE, AND COPPER OXIDE FROM SUBSTRATES HAVING COPPER, METAL HARDMASK AND LOW-K DIELECTRIC MATERIAL

INCORPORATION BY REFERENCE

The entirety of U.S. patent application Ser. No. 13/209,859, filed on Aug. 15, 2011, is hereby expressly incorporated herein by reference.

BACKGROUND OF THE INVENTION

The presently disclosed and claimed inventive concept(s) relates to compositions and methods for cleaning integrated circuit substrates, and, more particularly, to compositions and methods comprising a halide anion which are effective in removing photoresist, post etch residue, and/or post planarization residue from substrates comprising copper, low-k dielectric material and metal hardmask, such as TiN, TiNxOy and W.

Devices with critical dimensions on the order of 90 nanometers (nm) have involved integration of copper conductors and low-k dielectrics, and they require alternating material deposition processes and planarization processes. As the technology nodes advance to 45 nm and smaller, the decreasing size of semiconductor devices makes achieving critical profile control of vias and trenches more challenging. Integrated circuit device companies are investigating the use of metal hardmasks to improve etch selectivity to low-k materials and thereby gain better profile control.

In order to obtain high yield and low resistance interconnects, the polymers on the sidewalls and the particulate/polymer residues at the via bottoms that are generated during etching must be removed prior to the next process step. It would be very beneficial if the cleaning solution can also effectively etch the selected hardmask to form an intermediate morphology, e.g., a pulled-back/rounded morphology. A pulled-back/rounded morphology could prevent undercutting the hardmask, which, in turn, could enable reliable deposition of barrier metal, Cu seed layer and Cu filling. Alternatively, fully removing the metal hardmask using the same composition could offer numerous benefits to downstream process steps, particularly chemical mechanical polishing (CMP), by eliminating a need for barrier CMP.

Following almost every step in the fabrication process, e.g., a planarization step, a trenching step, or an etching step, cleaning processes are required to remove residues of the plasma etch, oxidizer, abrasive, metal and/or other liquids or particles that remain and which can contaminate the surface of the device if not effectively removed. Fabrication of advanced generation devices that require copper conductors and low-k dielectric materials (typically carbon-silica or porous silica materials), give rise to the problem that both materials can react with and be damaged by various classes of prior art cleaners.

Low-k dielectrics, in particular, may be damaged in the cleaning process as evidenced by etching, changes in porosity/size, and ultimately changes in dielectric properties. Time required to remove residues depends on the nature of the residue, the process (heating, crosslinking, etching, baking, and/or ashing) by which it is created, and whether batch or single wafer cleaning processes are used. Some residues may be cleaned in a very short period of time, while some residues require much longer cleaning processes. Compatibility with both the low-k dielectric and with the copper conductor over the duration of contact with the cleaner is a desired characteristic.

When TiN, TiNxOy or W is used as an etching hard mask to gain high selectivity to low-k materials during a dry etching process in processing advanced copper/low-k semiconductor devices, effective cleaning compositions that can selectively etch TiN, TiNxOy or W must not only be compatible with copper and the low-k materials, but must also be effective in simultaneously removing polymeric materials and etch residues.

With the continuing reduction in device critical dimensions and continuing needs for production efficiency and device performance, there is a need for improved cleaning compositions.

SUMMARY OF THE INVENTION

The presently claimed and disclosed inventive concept(s) relate to an improved semiconductor processing composition, i.e., a wet cleaning formulation, for removing photoresist, polymeric materials, etching residues and copper oxide from substrates wherein the substrate comprises copper, a low-k dielectric material(s) and metal hard mask selected from TiN, TiNxOy or W. The composition comprises water, at least one halide anion selected from $Cl^-$ or $Br^-$, and at least one oxidizing agent. Although not required for carrying out the invention, at least one Cu corrosion inhibitor may also be present in the composition where the composition is to be deployed in semiconductor processing at FEOL applications and other applications where corrosion of Cu components is not a concern. In cases where the metal hard mask is TiN or TiNxOy, the composition in one embodiment will also include a base, i.e., hydroxide source, as appropriate to maintain the pH of the composition at a value of at least 7 or above for best results.

In some cases where the metal hard mask is TiN or TiNxOy, the composition in an alternate embodiment may have a pH at a value of less than 7, and even as low as 4.6, and achieve satisfactory results.

In cases where the metal hard mask is W, the pH working range according to yet another embodiment can be basic or acidic and achieve satisfactory results.

The oxidizing agent is selected from the group consisting of hydrogen peroxide, ozone, ferric chloride, permanganate, peroxoborate, perchlorate, persulfate, ammonium peroxydisulfate, peracetic acid, urea hydroperoxide, percarbonate, perborate, and mixtures thereof. When present, the Cu corrosion inhibitor is selected from the group consisting of a heterocyclic compound which contains a nitrogen atom in the form of =N— as a ring form member. The heterocyclic compound can be used singly or the Cu corrosion inhibitor can comprise a mixture of such heterocyclic compounds. In addition, mercaptan, thiourea, aromatic hydrazides, Schiff bases, indoles and derivatives thereof may also produce satisfactory results in inhibiting Cu corrosion.

In another embodiment the invention comprises a method for simultaneously removing one or more of photoresist, polymeric materials, etching residues and copper oxide from a substrate comprising copper, low-k dielectric material and TiN, TiNxOy or W. The method comprises applying to the substrate an aqueous composition consisting essentially of at least one halide anion selected from $Cl^-$ or $Br^-$, at least one oxidizing agent selected from the group set forth above, and optionally at least one Cu corrosion inhibitor selected from the group set forth above. In cases where the metal hard mask is TiN or TiNxOy, the composition may also include a base, i.e., hydroxide source, as appropriate to maintain the pH of the composition at a value of at least 7 or above for best results. In some cases where the metal hard mask is TiN or TiNxOy, the composition in an alternate embodiment may have a pH at a value of less than 7, and even as low as 4.6, and achieve satisfactory results. In cases where the metal hard mask is W, the pH working range can be basic or acidic and achieve satisfactory results. The amount of undesirable residue to be removed in any given processing step will influence the selection of operating pH value for the composition.

The compositions and method according to the inventive concepts described herein are uniquely capable of selectively etching TiN, TiNxOy or W, are compatible with Cu and low-k dielectric materials, and can also simultaneously remove copper oxides, polymeric materials and etch residues from the substrate being treated. A composition formulated according to the invention and exhibiting an inherently high etch rate for TiN, TiNxOy or W enables processing at low temperature, e.g., temperatures less than 65° C. A relatively low temperature process exhibits a reduced oxidizer decomposition rate, which, in turn, extends the useful composition bath life. Additionally, compositions according to the invention which exhibit high TiN, TiNxOy or W etch rates are desirable because they can reduce device processing time and thereby increase device throughput. Typically, high TiN, TiNxOy or W etch rates have been accomplished by increasing process temperatures. However, for single wafer process applications, the highest processing temperature is around 65° C., which, in turn, can limit the upper end of TiN etch rates, and thereby limit complete removal of the TiN metal hardmask. Compositions according to the invention can effectively deliver high etch rates for TiN, TiNxOy or W with single wafer tool applications in a temperature range of from 20° C. to 60° C., and the TiN, TiNxOy or W metal hardmask can be fully removed with single wafer application process equipment if so desired.

BRIEF DESCRIPTION OF THE DRAWINGS

FIGS. 2 and 3 are graphs of metal hard mask etch rate vs. concentration of halide anion at pH 8.7 and 30° C.

FIGS. 8 and 9 are graphs of metal hard mask etch rate vs. concentration of halide anion at pH 8.7 and 55° C.

DETAILED DESCRIPTION OF THE INVENTION

It is recognized that various components of the compositions of this invention may interact, and, therefore, any composition is expressed as the amount of various components which, when added together, form the composition. Unless specifically stated otherwise, any composition given in percent is percent by weight of that component that has been added to the composition. When the composition is described as being substantially free of a particular component, generally there are numeric ranges provided to guide one of ordinary skill in the art to what is meant by "substantially free," but in all cases "substantially free" encompasses the preferred embodiment where the composition is totally free of that particular component.

According to a first embodiment, the present invention is a semiconductor processing composition comprising water, at least one halide anion selected from $Cl^-$ or $Br^-$, at least one oxidizing agent, and optionally at least one hydroxide source depending on the desired pH for the composition. Although not required for carrying out the invention, at least one Cu corrosion inhibitor may also be present in the composition where the composition is to be deployed in semiconductor processing at FEOL applications and other applications where corrosion of Cu components is not a concern. In one embodiment, the formulations preferably have a pH of from 7.0 and higher for removing hardmasks comprising TiN and TiNxOy. As pointed out above, in some applications the formulations can produce satisfactory results when the pH is below 7. For removing hardmask comprising W, the composition comprises water, at least one halide anion selected from $Cl^-$ or $Br^-$, at least one oxidizing agent, and the pH value can range from acidic to basic. At least one Cu corrosion inhibitor may also be present. The compositions of the invention are effective in simultaneously removing photoresist, polymeric materials, etching residues and copper oxide from a substrate which includes copper, low-k dielectric material and a metal hardmask selected from TiN, TiNxOy or W. The cleaning composition can effectively etch the metal hardmask to form an intermediate morphology, e.g., a pulled-back/rounded morphology, as shown diagrammatically in FIG. 1B. However, the composition is also capable of fully removing the metal hardmask as shown diagrammatically in FIG. 1C.

Figure 1A:
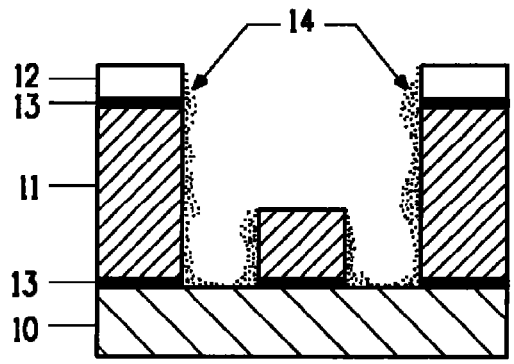
FIGS. 1A to 1C are cross-sectional diagrams of a semiconductor device as received and during and after processing according to the inventive concepts.

FIG. 1A is a cross sectional diagram of a semiconductor device which shows copper conductor 10 in relationship to low-k dielectric material 11, metal hardmask 12, and an interlayer insulating film 13. The interlayer insulating film will typically be p-TEOS (Tetra Ethyl Ortho Silicate) film or SiON (depending on the source). Etch residue, polymer, photoresist 14 remains after a typical processing step in device fabrication.

Figure 1B:
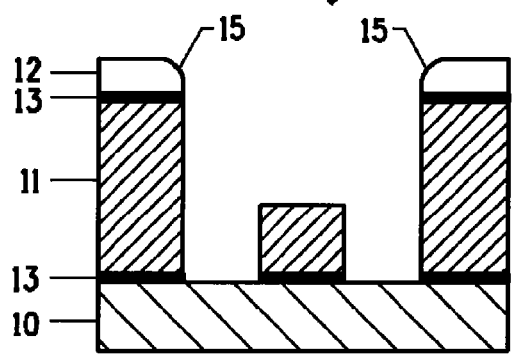
Figure 1C:
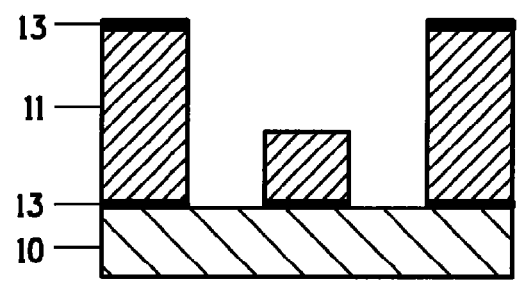
Figure 4:
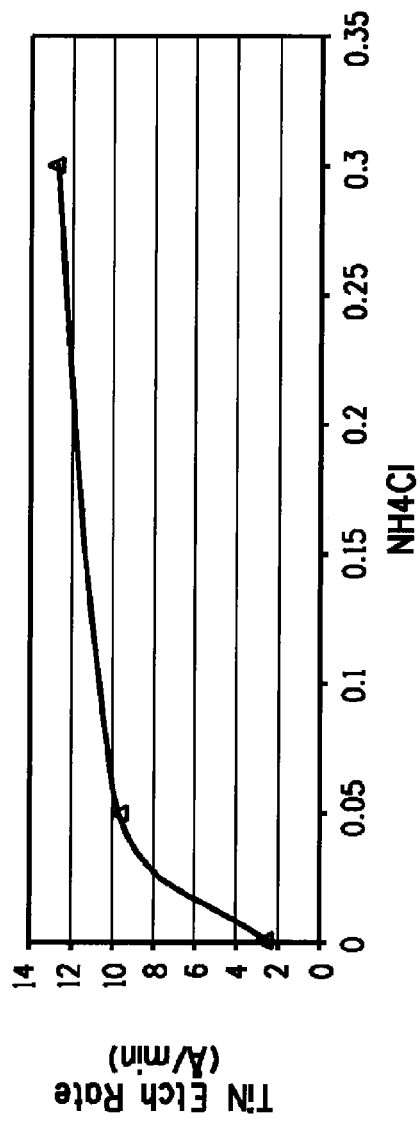
FIGS. 4 and 5 are graphs of metal hard mask etch rate vs. concentration of halide anion at pH 7 and 30° C.
Figure 5:
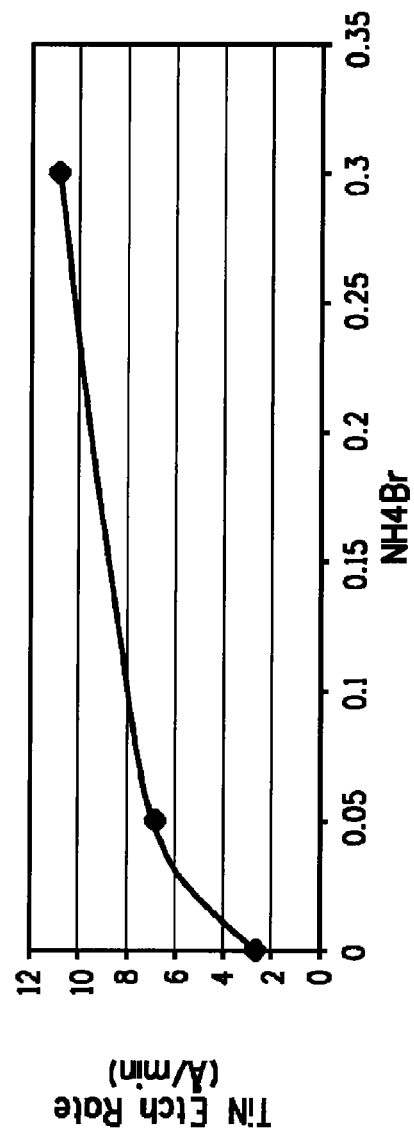

The compositions and method according to the inventive concepts described herein are uniquely capable of selectively etching metal hard mask, e.g., TiN, TiNxOy and W, whereby the metal hardmask is only partially removed to form a pullback corner rounding scheme 15 as shown in FIG. 1B. An intermediate pullback corner rounding scheme is important because it can prevent undercutting of the hardmask, thus enabling reliable deposition of barrier metal, Cu seed layer, and Cu filling. Alternatively, the metal hardmask can be completely removed as shown in FIG. 1C. Complete removal of the hardmask eliminates the need for barrier CMP and subsequent post-CMP cleaning steps and thereby improves device fabrication yields.

The compositions and method according to the inventive concepts described herein are particularly applicable for processing single wafers in single wafer equipment wherein a higher processing temperature in the range of 75° C. is desirable. However, higher temperatures are known to contribute to degradation of the oxidizing agent which shortens bath life. It has been observed according to the inventive concepts described herein that satisfactory results can be achieved in processing multiple wafers at substantially lower temperatures in the range of from 20° C. to 60° C. to generate a TiN pullback scheme or to completely remove TiN metal hardmask.

Cosolvent

In some embodiments of this invention, the composition can contain a cosolvent that is miscible with water. Suitable cosolvents include, but are not limited to, sulfolane, N-methylpyrrolidone, and dimethylsulfoxide.

Oxidizing Agent

Oxidizing agents useful according to the inventive concept(s) are selected from any substance which removes metal electrons and raises the atomic valence and includes, but is not limited to the group consisting of hydrogen peroxide ($H_2O_2$), ozone, ferric chloride, permanganate peroxoborate, perchlorate, persulfate, ammonium peroxydisulfate, per acetic acid, urea hydroperoxide, nitric acid ($HNO_3$), ammonium chlorite ($NH_4ClO_2$), ammonium chlorate ($NH_4ClO_3$), ammonium iodate ($NH_4IO_3$), ammonium perborate ($NH_4BO_3$), ammonium perchlorate ($NH_4ClO_4$), ammonium periodate ($NH_4IO_3$), ammonium persulfate (($NH_4)_2S_2O_8$), tetramethylammonium chlorite (($N(CH_3)_4)ClO_2$), tetramethylammionium chlorate (($N(CH_3)_4)ClO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium periodate (($N(CH_3)_4)IO_4$), tetramethylammonium persulfate (($N(CH_3)_4)_4S_2O_8$), (($CO(NH_2)_2)H_2O_2$), peracetic acid ($CH_3(CO)OOH$), and mixtures thereof. Among the foregoing, $H_2O_2$ is a most preferred oxidizing agent being free of metals and provides ease of handling and lower relative cost.

The oxidizing agent or mixture thereof may be present in the composition at from about 0.0001 wt % to about 95 wt %, and preferably, for best results, at from about 1 wt % to about 80 wt %.

Cu Corrosion Inhibitor

A Cu corrosion inhibitor is an optional component in the composition of this invention. A copper corrosion inhibitor will usually be present in the inventive composition and associated process when used for BEOL (back end of line) applications, where the presence of a corrosion inhibitor is needed to protect copper surfaces from being etched or otherwise degraded. For other applications, including FEOL (Front End Of Line) applications, of the inventive composition and associated method, a corrosion inhibitor is not generally needed, i.e., slight etching/degradation of copper surfaces is not usually a concern, and a corrosion inhibitor is not present in the composition.

Cu Corrosion inhibitors are typically selected from the group consisting of a heterocyclic compound containing a nitrogen atom in the form of =N— as a ring form member, such as pyrrole and derivatives thereof, pyrazole and derivatives thereof, Imidazole and derivatives thereof, triazole and derivatives thereof, indazole and derivatives thereof and thioltriazole and derivatives thereof, benzotriazole, tolyltriazole, 5-phenyl-benzotriazole, 5-nitro-benzotriazole, 3-amino-5-mercapto-1,2,4-triazole, 1-amino-1,2,4-triazole, hydroxybenzotriazole, 2-(5-amino-pentyl)-benzotriazole, 1-amino-1, 2,3-triazole, 1-amino-5-methyl-1,2,3-triazole, 3-amino-1,2, 4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-aminotetrazole, 5-aminotetrazole monohydrate, 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, mercaptobenzimidazole, 4-methyl-4H-1,2,4-triazole-3-thiol, 5-amino-1,3, 4-thiadiazole-2-thiol, benzothiazole, and mixtures thereof. Among the foregoing, pyrazole is a preferred Cu corrosion inhibitor for ease of handling and lower relative cost.

Other suitable Cu corrosion inhibitors include, but are not limited to indole, aromatic hydrazides and Schiff base compounds.

The Cu corrosion inhibitor or mixture thereof may be present in the composition at from about 0.0001 wt % to about 30 wt %, and preferably, for best results, at from about 0.01 wt % to about 10 wt %.

Halide Anion

The halide anion component may be selected from any chemical compounds which are capable of generating $Cl^-$ and $Br^-$ anions, such as $NH_4Cl$, $NH_4Br$, quaternary ammonium bromide, $NR_4^{(+)}Br^{(-)}$, or quaternary ammonium chloride, $NR_4^{(+)}Cl^{(-)}$, R being an alkyl group or an aryl group. Preferred compounds include, but are not limited to, $NH_4Cl$ and $NH_4Br$.

The halide anion may be present in the composition at concentrations of from about 0.001 wt % to about 20 wt %. Best results have been observed when the halide anion is present in the composition in a range of from about 0.05 wt % to about 5 wt %.

EXAMPLES

Compositions according to the invention are now explained in detail by reference to the inventive concepts and comparative examples which follow, but the present invention is not limited by these examples.

The compositions shown in Tables 1A & 1B and in Table 6A, 6B & 6C were prepared using water as the solvent, pyrazole as the Cu corrosion inhibitor, $H_2O_2$ as the oxidizing agent, and diglycolamine (DGA) as a base to adjust pH. (Water levels in the composition tables below are designated as "DI balance", which means that water is present at a level such that the weight percent of all components, including water, is equal to 100 weight percent.) The compositions shown in Table 5A were prepared using water as the solvent, pyrazole as Cu corrosion inhibitor, $H_2O_2$ as the oxidizing agent, and glycolic acid (GA) to adjust pH. Composition pH can generally be adjusted using any suitable acid or base (i.e., proton source for acidic formulation or hydroxide source for basic formulation) which does not adversely affect the semiconductor device being treated. TiN and Cu etch rate evaluations were carried out for ten minutes at 20° C., ten minutes at 30° C. and 40° C., and five minutes at 55° C. in the pH range from 7.0-9.0. TiN and Cu thicknesses were measured using a Four Dimensions Four Point Probe Meter 333A, whereby the resistivity of the film was correlated to the thickness of the film remaining. The etch rate was calculated as the thickness change (before and after chemical treatment) divided by the chemical treatment time. Chemical solution pH was measured with a Beckman 260 pH/Temp/mV meter. The $H_2O_2$ used in these experiments was semiconductor grade PURANAL (Aldrich 40267). Residue removal performance experiments were conducted at 30° C. for 90 seconds, and the residue removal efficiency and TiN pullback were evaluated from SEM results (Hitachi S-5500). TEOS etch rate experiments were conducted at 30° C., 50° C. and at 55° C. for 30 minutes, respectively. The TEOS thickness was measured with Horiba JoBin Yvon Auto SE Spectroscopic Ellipsometer. TEOS etch rate was calculated as the thickness change (before and after chemical treatment) divided by the chemical treatment time.

TiN and Cu Etch Rate

The formulations shown in Table 1A & 1B were prepared and TiN and Cu etch rate evaluations were carried out as described above at a temperature of 30° C.

TiN and Cu etch rate evaluations were carried out as described above at a temperature of 20° C.

TABLE 3

TiN and Cu Etch Rate for Various Formulations at 20° C.

| Formulation | Process Temp (° C.) | TiN (Å/min) | Cu (Å/min) |
|---|---|---|---|
| HCX-T002C-32-P8 | 20 | 2.96 | 0.07 |
| HCX-T002C-32-Br005-P8 | | 7.57 | 0.01 |

TABLE 1A

Formulations and their pH

| Formulation | NH4Br (10%) | NH4Cl (10%) | Pyrazole | DGA (10%) | DI balance | H2O2 (30%) | pH |
|---|---|---|---|---|---|---|---|
| HCX-T002C-32-Br0-P8 | 0 | 0 | 0.5 | 0.9106 | 80 | 20 | 8.7 |
| HCX-T002C-32-Br005-P8 | 0.5 | 0 | 0.5 | 1.1345 | 80 | 20 | 8.7 |
| HCX-T002C-32-Br03-P8 | 3 | 0 | 0.5 | 1.7490 | 80 | 20 | 8.7 |
| HCX-T002C-32-Cl005-P8 | 0 | 0.5 | 0.5 | 1.0970 | 80 | 20 | 8.7 |
| HCX-T002C-32-Cl03-P8 | 0 | 3 | 0.5 | 2.2280 | 80 | 20 | 8.7 |

TABLE 1B

Formulations and their pH

| Formulation | NH4Br (10%) | NH4Cl (10%) | Pyrazole | DGA (10%) | DI balance | H2O2 (30%) | pH |
|---|---|---|---|---|---|---|---|
| HCX-T002C-32-Br0-P7 | 0 | 0 | 0.5 | 0.0386 | 80 | 20 | 7.0 |
| HCX-T002C-32-Br005-P7 | 0.5 | 0 | 0.5 | 0.0520 | 80 | 20 | 7.0 |
| HCX-T002C-32-Br03-P7 | 3 | 0 | 0.5 | 0.0801 | 80 | 20 | 7.0 |
| HCX-T002C-32-Cl005-P7 | 0 | 0.5 | 0.5 | 0.0383 | 80 | 20 | 7.1 |
| HCX-T002C-32-Cl03-P7 | 0 | 3 | 0.5 | 0.0440 | 80 | 20 | 6.9 |

TABLE 2

TiN and Cu Etch Rate for Various Formulations at 30° C.

| Formulation | Process Temp (° C.) | TiN (Å/min) | Cu (Å/min) |
|---|---|---|---|
| HCX-T002C-32-P8 | 30 | 19.05 | 0.32 |
| HCX-T002C-32-Br005-P8 | | 31.39 | 0.61 |
| HCX-T002C-32-Br03-P8 | | 40.53 | 0.58 |
| HCX-T002C-32-Cl005-P8 | | 34.42 | 0.51 |
| HCX-T002C-32-Cl03-P8 | | 47.03 | 1.05 |
| HCX-T002C-32-P7 | | 2.74 | −0.23 |
| HCX-T002C-32-Br005-P7 | | 6.92 | 0.15 |
| HCX-T002C-32-Br03-P7 | | 11.14 | −0.26 |
| HCX-T002C-32-Cl005-P7 | | 9.56 | 0.20 |
| HCX-T002C-32-Cl03-P7 | | 12.90 | 0.18 |

The TiN etch rate results at 30° C. are shown graphically in FIGS. 2, 3, 4 and 5 where it can be seen that for $NH_4Cl$ and $NH_4Br$ the etch rate for TiN metal hardmask increases as the concentration of halide anion increases from 0 to 0.3 wt %; and low Cu etch rates in Table 2 demonstrate that the chemical components of the composition are compatible with Cu.

TABLE 3-continued

TiN and Cu Etch Rate for Various Formulations at 20° C.

| Formulation | Process Temp (° C.) | TiN (Å/min) | Cu (Å/min) |
|---|---|---|---|
| HCX-T002C-32-Br03-P8 | | 16.14 | 0.24 |
| HCX-T002C-32-Cl005-P8 | | 9.07 | 0.05 |
| HCX-T002C-32-Cl03-P8 | | 16.06 | 0.37 |

Figure 6:
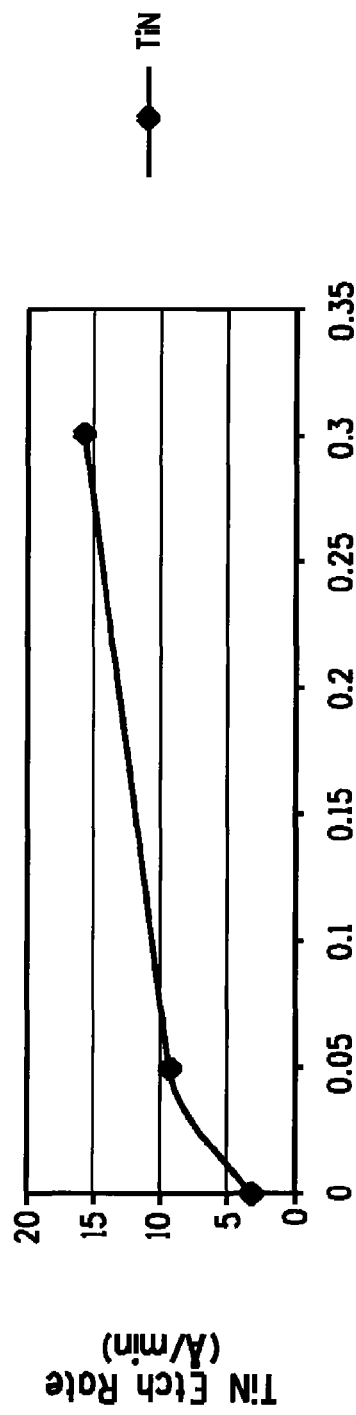
FIGS. 6 and 7 are graphs of metal hard mask etch rate vs. concentration of halide anion at pH 8.7 and 20° C.
Figure 7:
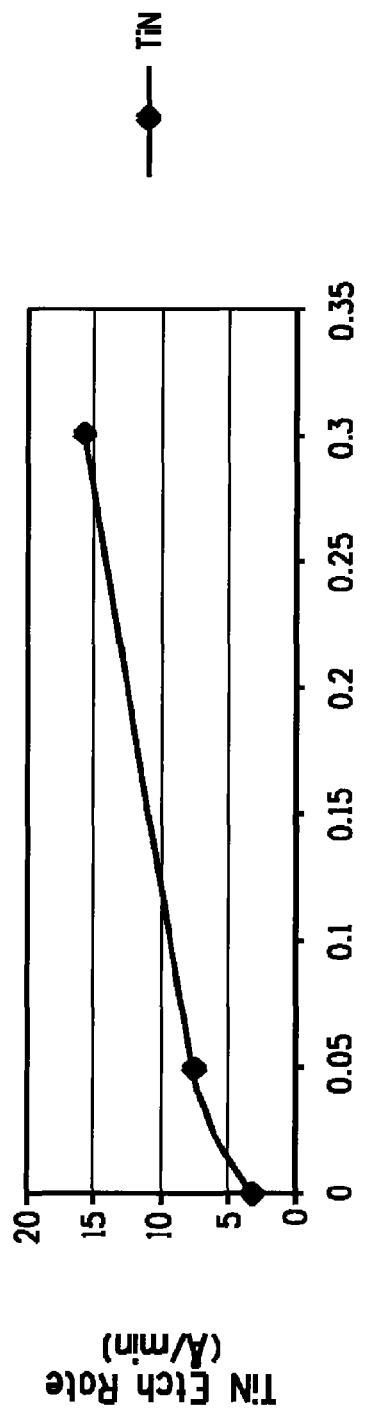
Figure 10A:
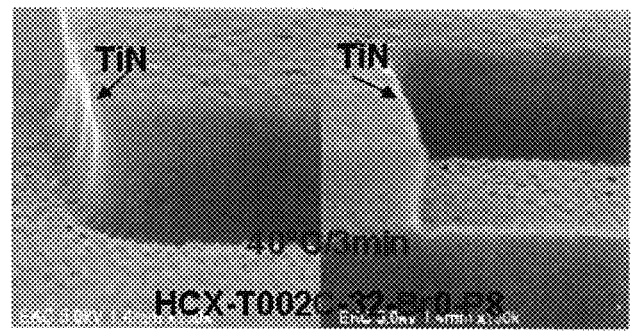
FIGS. 10A to 10I are SEM images of TiN metal hardmask removal using a composition according to the invention.
Figure 10B:
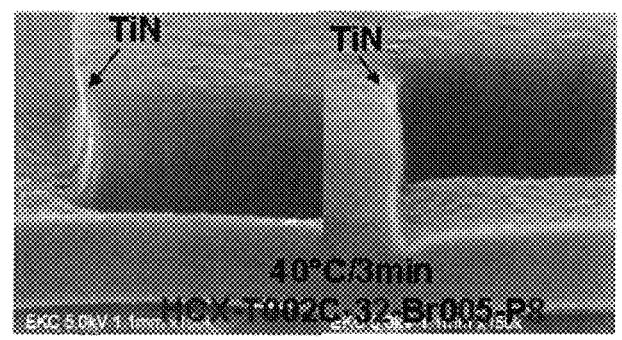
Figure 10C:
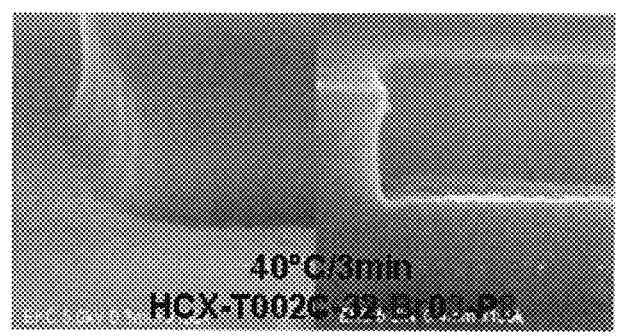
Figure 10D:
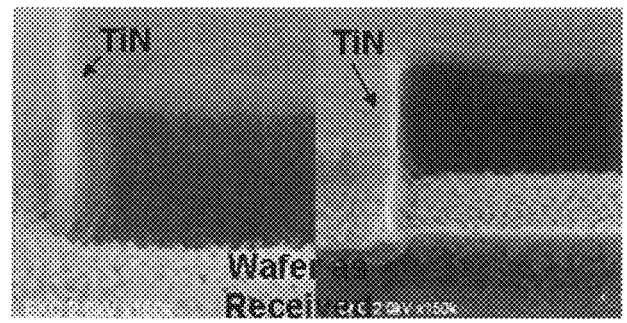
Figure 10E:
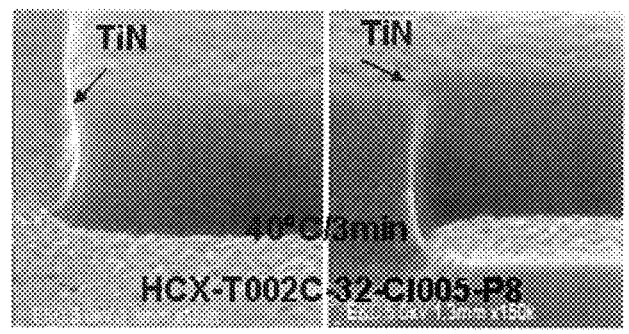
Figure 10F:
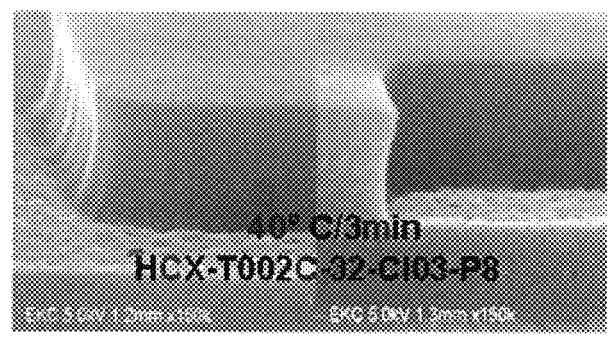
Figure 10G:
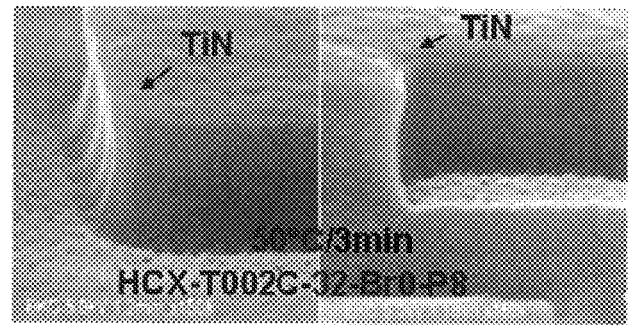
Figure 10H:
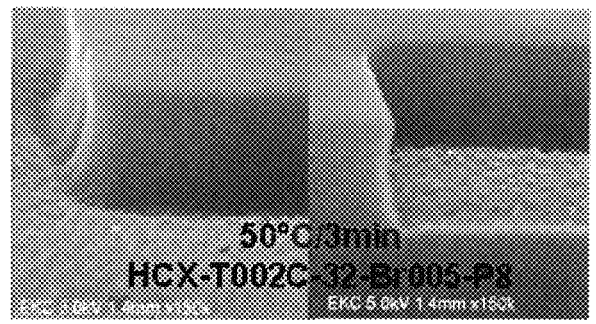
Figure 10I:
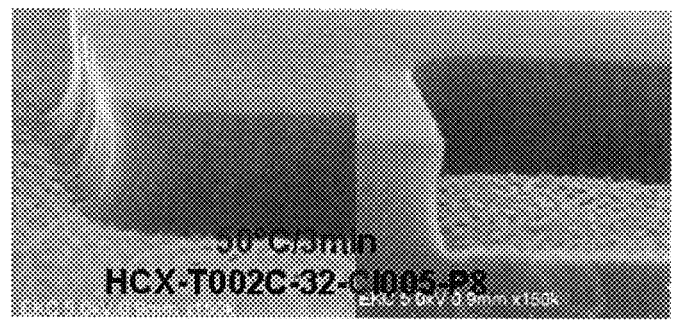
Figure 11:
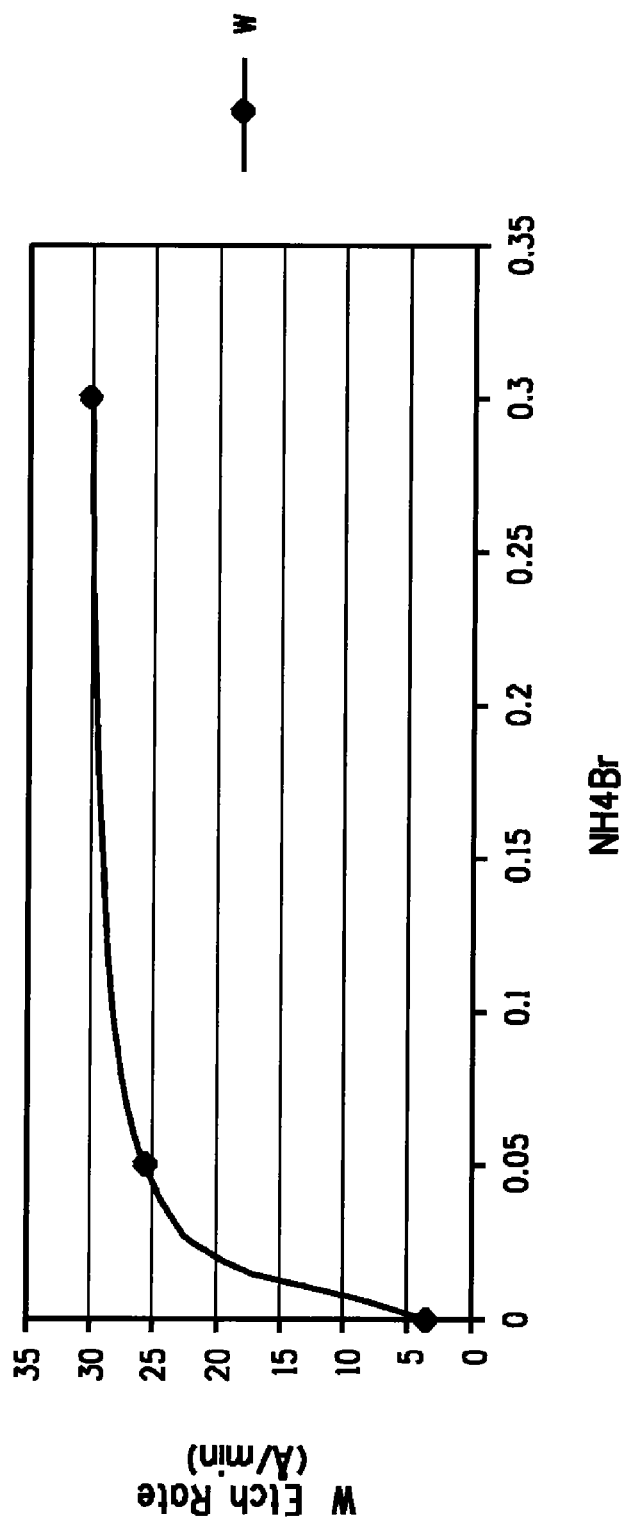
FIGS. 11 to 14 are graphs of W metal hardmask etch rate at 30° C. and pH values of 3.4 and 8.7.
Figure 12:
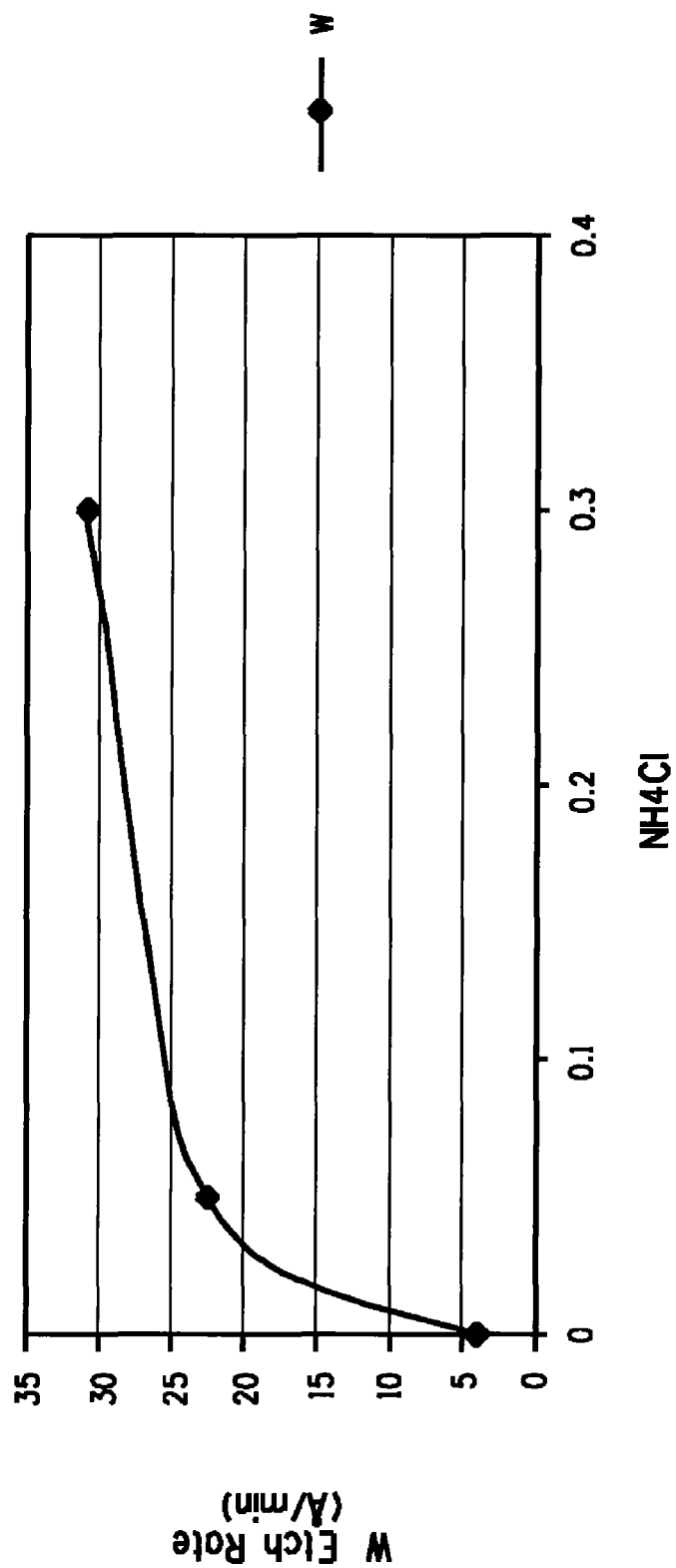
Figure 13:
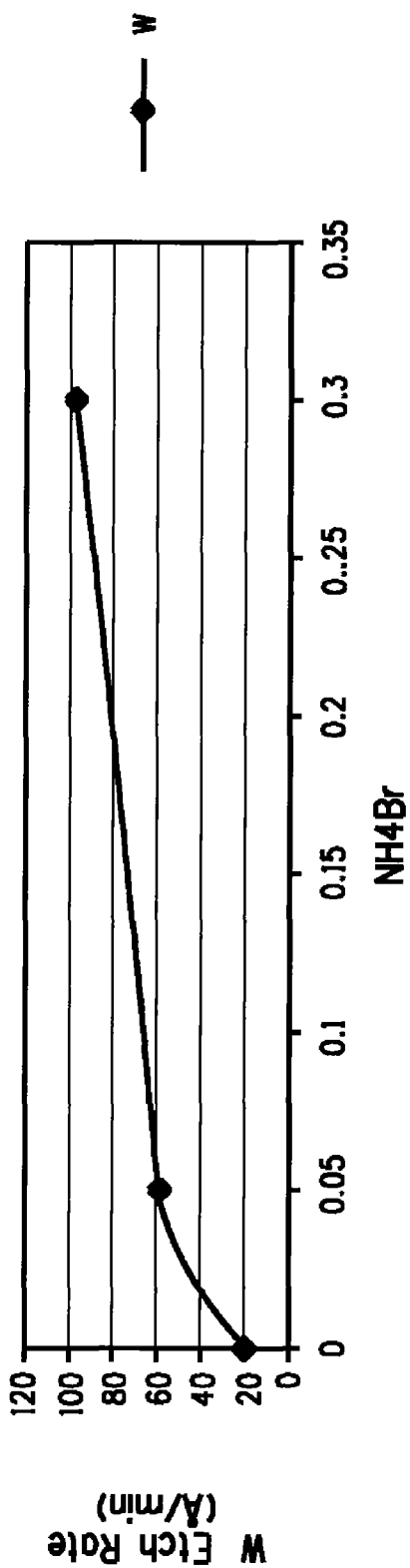
Figure 14:
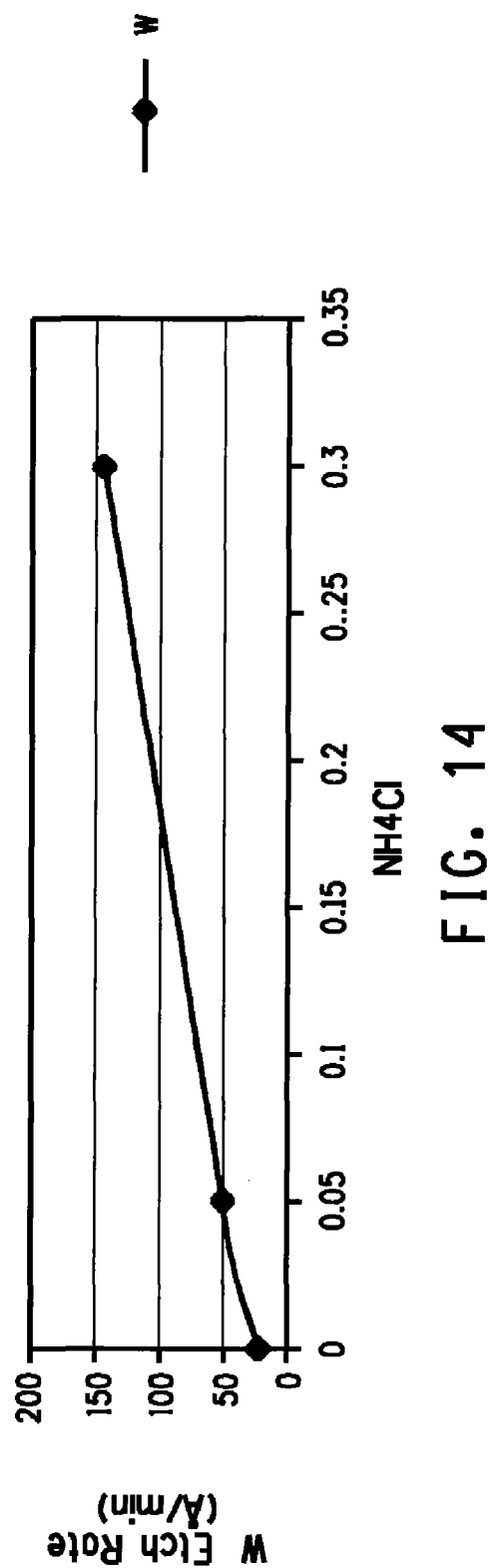

The TiN etch rate results at 20° C. are shown graphically in FIGS. 6 and 7 where it can be seen that for $NH_4Cl$ and $NH_4Br$ the etch rate for TiN metal hardmask increases as the concentration of halide anion increases from 0 to 0.3 wt %, and the low Cu etch rates in Table 3 show that the chemical components of the composition are compatible with Cu.

TiN and Cu etch rate evaluations were carried out as described above at a temperature of 55° C.

TABLE 4

TiN and Cu Etch Rate for Various Formulations at 55° C.

| Formulation | Process Temp (° C.) | TiN (Å/min) | Cu (Å/min) |
|---|---|---|---|
| HCX-T002C-32-P8 | 55 | 108.88 | 1.29 |
| HCX-T002C-32-Br005-P8 | | 120.45 | 0.66 |
| HCX-T002C-32-Br03-P8 | | 140.87 | 0.82 |
| HCX-T002C-32-Cl005-P8 | | 136.47 | 2.40 |
| HCX-T002C-32-Cl03-P8 | | 145.03 | 5.46 |

The TiN etch rate at 55° C. results are shown graphically in FIGS. 8 and 9 where it can be seen that for $NH_4Cl$ and $NH_4Br$ the etch rate for TiN metal hardmask increases as the concentration of halide anion increases from a value of 0 to 0.3 wt %, and the low Cu etch rates in Table 4 indicate that the chemical components in the composition are compatible with Cu SEM pictures of TiN removal are shown in FIG. 10. The TiN hardmask pullback becomes more pronounced as the $NH_4Br$ (or $NH_4Cl$) concentration is increased from 0 to 0.05% ($NH_4Br$ shown in FIG. 10A and FIG. 10B, and $NH_4Cl$ shown in FIG. 10A and FIG. 10E), and TiN is completely removed with a 0.3 wt % $NH_4Br$ (or $NH_4Cl$) formulation at 40° C. (FIG. 10C and FIG. 10F). In the absence of $NH_4Br$ (or $NH_4Cl$), when the process temperature is increased from 40° C. to 50° C., the TiN pullback becomes more significant (FIG. 10A to FIG. 10G). Complete TiN removal is achieved with a 0.3% $NH_4Br$ (or $NH_4Cl$) formulation at 40° C. (FIG. 10C and FIG. 10F), and with 0.05% $NH_4Br$ (or $NH_4Cl$) at 50° C. (FIG. 10H and FIG. 10I). The results indicate that to achieve a fixed TiN etch rate (i.e., to form a specific TiN pullback morphology), a formulation containing $NH_4Br$ (or $NH_4Cl$) requires a much lower process temperature compared with a formulation without $NH_4Br$ (or $NH_4Cl$), and the TiN etch rate increases with increasing $NH_4Br$ (or $NH_4Cl$) concentration. The addition of $NH_4Br$ (or $NH_4Cl$) makes possible the complete removal of TiN metal hard mask with single wafer application process equipment.

W Etch Rate

The formulations shown in Table 1 and Table 5A & 5B were prepared, and W etch rate evaluations were carried out as described above at 30° C.

TABLE 5B

Formulations and W etch rate at 30° C., pH 7 and pH 8.7

| Formulation | Process Temp (° C.) | W (Å/min) |
|---|---|---|
| HCX-T002C-32-P8 | 30 | 21.87 |
| HCX-T002C-32-Br005-P8 | | 56.18 |
| HCX-T002C-32-Br03-P8 | | 97.08 |
| HCX-T002C-32-Cl005-P8 | | 50.60 |
| HCX-T002C-32-Cl03-P8 | | 143.17 |
| HCX-T002C-32-P7 | | 7.11 |
| HCX-T002C-32-Br005-P7 | | 27.08 |
| HCX-T002C-32-Br03-P7 | | 31.62 |
| HCX-T002C-32-Cl005-P7 | | 28.80 |
| HCX-T002C-32-Cl03-P7 | | 36.78 |

The results are shown graphically in FIGS. 11, 12, 13 and 14 where it can be seen that for $NH_4Cl$ and $NH_4Br$ the etch rate for W metal hardmask increased as the concentration of halide anion increased from 0 to 0.3 wt % for the pH range of from acidic to basic.

Low-K Compatibility

The compositions shown in Table 6A, 6B & 6C were prepared and TEOS etch rate evaluations were carried out as described above at temperatures of 30° C. and 50° C., respectively.

TABLE 5A

Formulations and W etch rate at 30° C., pH 3

| Formulation | Component | | | | | | W Etch Rate (Å/min) at 30° C. | pH |
|---|---|---|---|---|---|---|---|---|
| | Pyrazole | NH4Br (10%) | NH4Cl (10%) | H2O2 (30%) | DI Balance | GA (70%) | | |
| HCX32-0Br-p3 | 0.5 | 0 | 0 | 20 | 80 | 0.819 | 3.67 | 3.4 |
| HCX32-Br005-p3 | 0.5 | 0.5 | 0 | 20 | 80 | 0.249 | 25.81 | 3.5 |
| HCX32-Br03-p3 | 0.5 | 3 | 0 | 20 | 80 | 0.238 | 30.22 | 3.4 |
| HCX32-Cl005-p3 | 0.5 | 0 | 0.5 | 20 | 80 | 0.263 | 22.51 | 3.4 |
| HCX32-Cl03-p3 | 0.5 | 0 | 3 | 20 | 80 | 0.258 | 31.01 | 3.4 |

TABLE 6A

TEOS Etch Rate and NH₄Br Formulations at pH 7
Formulation and TEOS Etch Rate

| Formulation | NH4Br (10%) | BTA | Pyrazole | DGA (10%) | DI balance | H2O2 (30%) | TEOS (30° C.) Etch Rate (Å/min) | TEOS (50° C.) Etch Rate (Å/min) | pH |
|---|---|---|---|---|---|---|---|---|---|
| HCX-T002C-32B-BrCl0 | 0  | 0.8 | 0   | 0.2934 | 80 | 20 | −0.13 | 0.42  | 7.1 |
| HCX-T002C-32B-Br03  | 3  | 0.8 | 0   | 0.3134 | 80 | 20 | 0.17  | 0.16  | 7.0 |
| HCX-T002C-32B-Br1   | 10 | 0.8 | 0   | 0.3288 | 80 | 20 | 0.22  | 0.36  | 7.0 |
| HCX-T002C-32B-Br3   | 30 | 0.8 | 0   | 0.4166 | 80 | 20 | 0.08  | 0.17  | 7.0 |
| HCX-T002C-32B-Br5   | 50 | 0.8 | 0   | 0.4336 | 80 | 20 | 0.05  | 0.21  | 7.0 |
| HCX-T002C-32-Br0    | 0  | 0   | 0.5 | 0.0386 | 80 | 20 | 0.01  | 0.17  | 7.0 |
| HCX-T002C-32-Br3    | 30 | 0   | 0.5 | 0.1749 | 80 | 20 | 0.15  | 0.21  | 7.0 |
| HCX-T002C-32-Br5    | 50 | 0   | 0.5 | 0.3106 | 80 | 20 | 0     | −0.07 | 7.0 |

TABLE 6B

TEOS Etch Rate and NH₄Cl Formulations at pH 7
Formulation and TEOS Etch Rate

| Formulation | NH4Cl (10%) | BTA | Pyrazole | DGA (10%) | DI balance | H2O2 (30%) | TEOS (30° C.) Etch Rate (Å/min) | TEOS (50° C.) Etch Rate (Å/min) | pH |
|---|---|---|---|---|---|---|---|---|---|
| HCX-T002C-32B-Cl0  | 0  | 0.8 | 0   | 0.2934 | 80 | 20 | −0.13 | 0.42  | 7.1 |
| HCX-T002C-32B-Cl03 | 3  | 0.8 | 0   | 0.4396 | 80 | 20 | −0.19 | −0.10 | 7.2 |
| HCX-T002C-32B-Cl1  | 10 | 0.8 | 0   | 0.4341 | 80 | 20 | 0.26  | 0.32  | 7.1 |
| HCX-T002C-32B-Cl3  | 30 | 0.8 | 0   | 0.5082 | 80 | 20 | 0.19  | 0.30  | 7.0 |
| HCX-T002C-32B-Cl5  | 50 | 0.8 | 0   | 0.5531 | 80 | 20 | −0.54 | 0.32  | 7.0 |
| HCX-T002C-32-Cl0   | 0  | 0   | 0.5 | 0.0386 | 80 | 20 | 0.01  | 0.17  | 7.0 |
| HCX-T002C-32-Cl3   | 30 | 0   | 0.5 | 0.2611 | 80 | 20 | 0.05  | 0.14  | 7.0 |
| HCX-T002C-32-Cl5   | 50 | 0   | 0.5 | 0.4751 | 80 | 20 | 0.11  | 0.07  | 7.1 |

TABLE 6C

TEOS Etch Rate and NH₄F Formulations at pH 7
Formulation and TEOS Etch Rate

| Formulation | NH4F (10%) | BTA | Pyrazole | DGA (10%) | DI balance | H2O2 (30%) | pH | TEOS (30° C.) Etch Rate (Å/min) | TEOS (50° C.) Etch Rate (Å/min) |
|---|---|---|---|---|---|---|---|---|---|
| HCX-T002C-32B-F0  | 0  | 0.8 | 0   | 0.294 | 80 | 20 | 7 | −0.13 | 0.42 |
| HCX-T002C-32B-F03 | 3  | 0.8 | 0   | 0.389 | 80 | 20 | 7 | −0.07 | 0.28 |
| HCX-T002C-32B-F1  | 10 | 0.8 | 0   | 0.387 | 80 | 20 | 7 | 0.20  | 0.69 |
| HCX-T002C-32B-F3  | 30 | 0.8 | 0   | 0.343 | 80 | 20 | 7 | 0.44  | 3.59 |
| HCX-T002C-32B-F5  | 50 | 0.8 | 0   | 0.245 | 80 | 20 | 7 | 1.78  | 8.88 |
| HCX-T002C-32-F0   | 0  | 0   | 0.5 | 0.031 | 80 | 20 | 7 | 0.01  | 0.69 |
| HCX-T002C-32-F3   | 30 | 0   | 0.5 | 0.001 | 80 | 20 | 7 | 0.63  | 3.53 |
| HCx-T002C-32-F5   | 50 | 0   | 0.5 | 0.000 | 80 | 20 | 7 | 1.45  | 8.99 |

Figure 15:
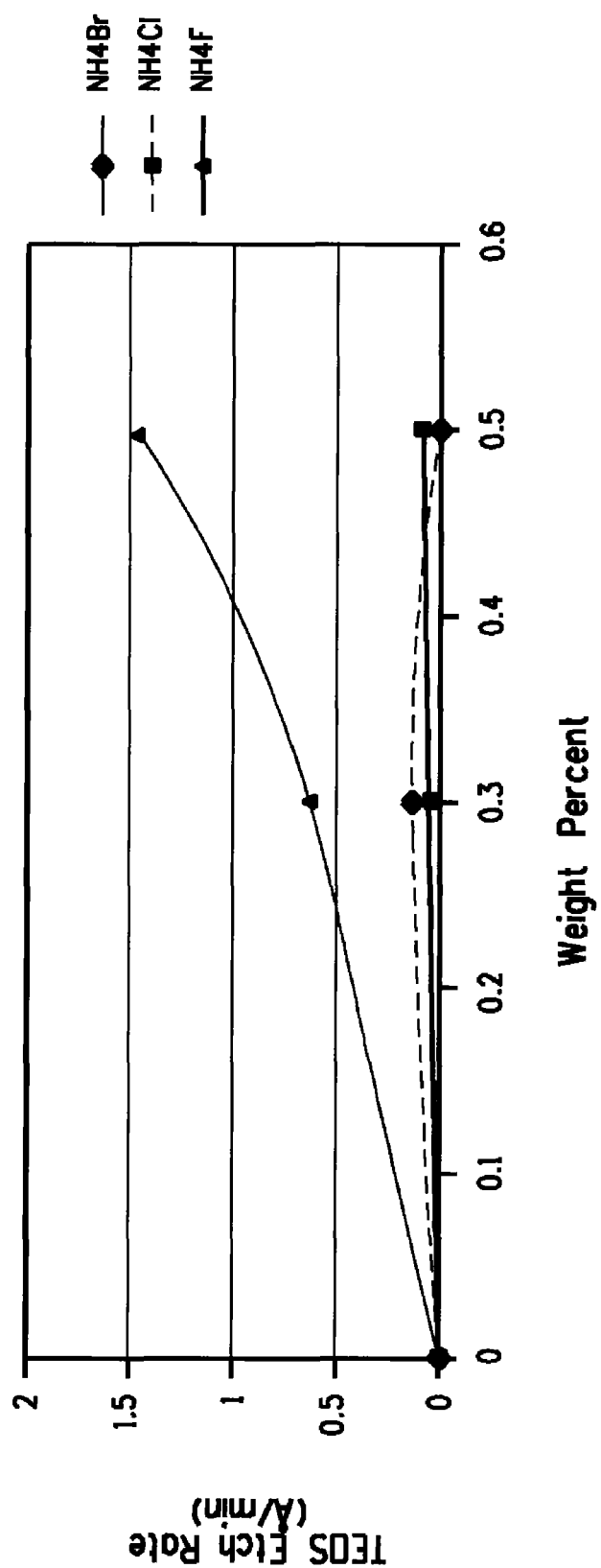
FIG. 15 is a graph of TEOS etch rate vs. $NH_4Cl$, $NH_4Br$, and $NH_4F$ at 30° C. and pH 7.
Figure 16:
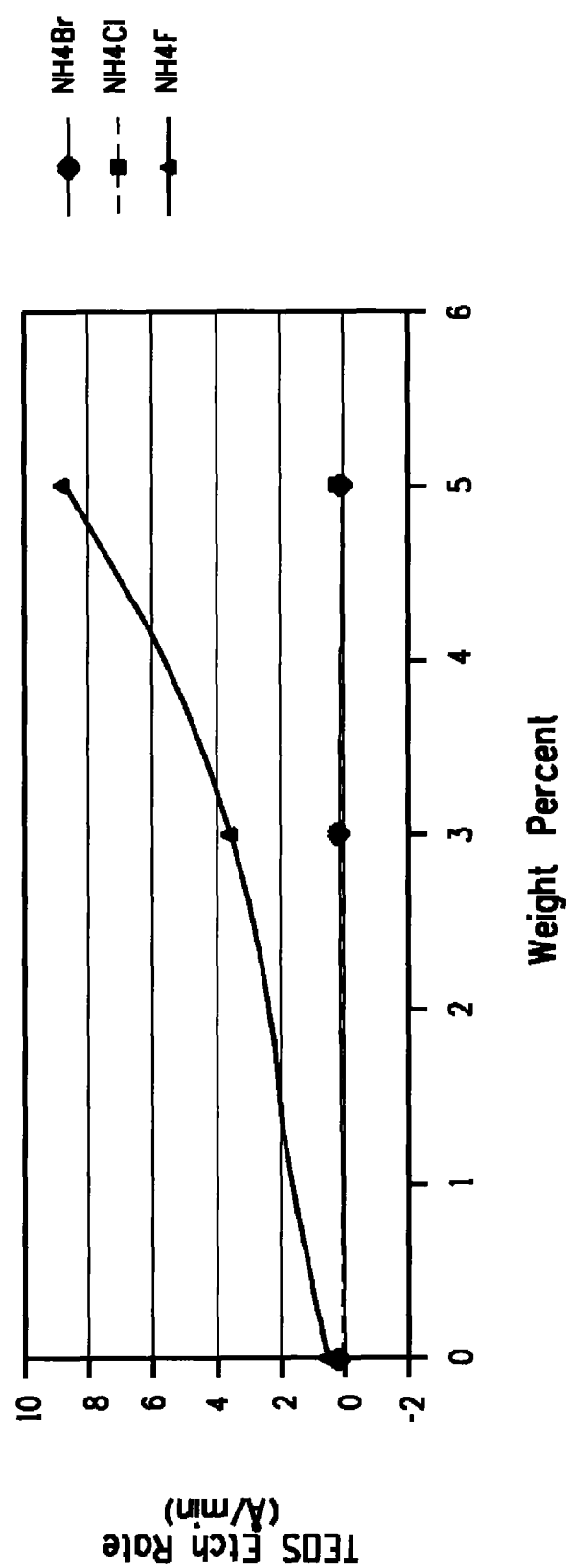
FIG. 16 is a graph of TEOS etch rate vs. $NH_4Cl$, $NH_4Br$, and $NH_4F$ at 50° C. and pH 7.
Figure 17A:
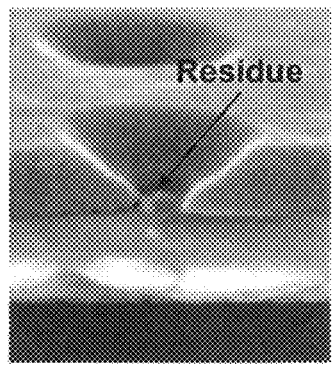
FIGS. 17A to 17D are SEM images of cleaning results for wafers as received and after processing with a composition according to the invention.
Figure 17B:
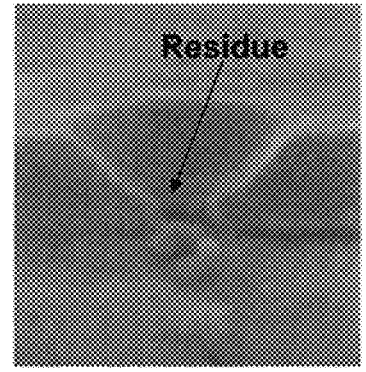
Figure 17C:
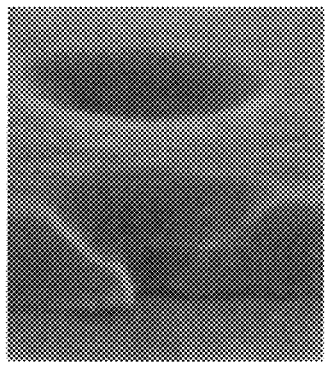
Figure 17D:
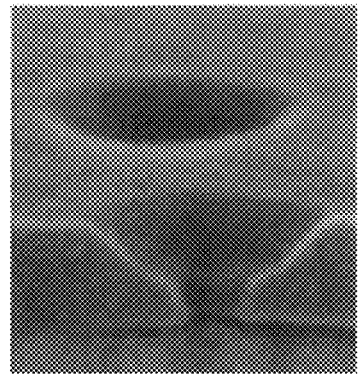
Figure 18:
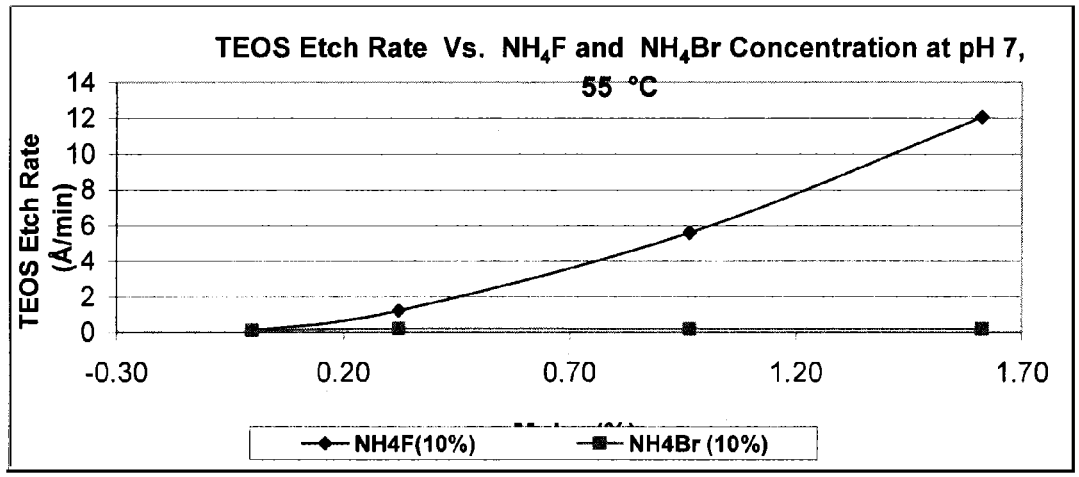
FIG. 18 is a graph of TEOS etch rate vs. $NH_4F$ and $NH_4Br$ at 55° C. and pH 7.
Figure 19:
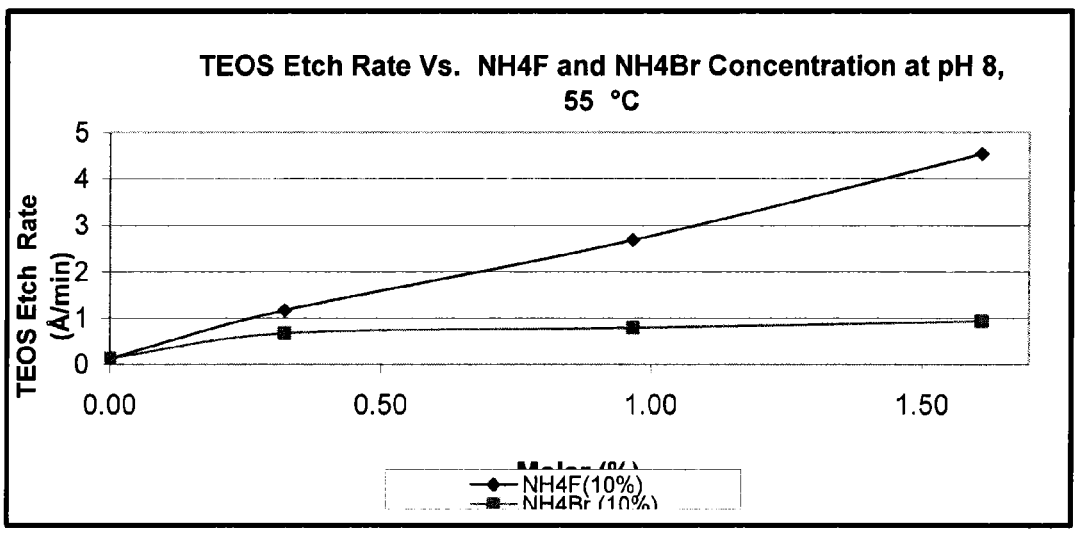
FIG. 19 is a graph of TEOS etch rate vs. $NH_4F$ and $NH_4Br$ at 55° C. and pH 8.
Figure 20:
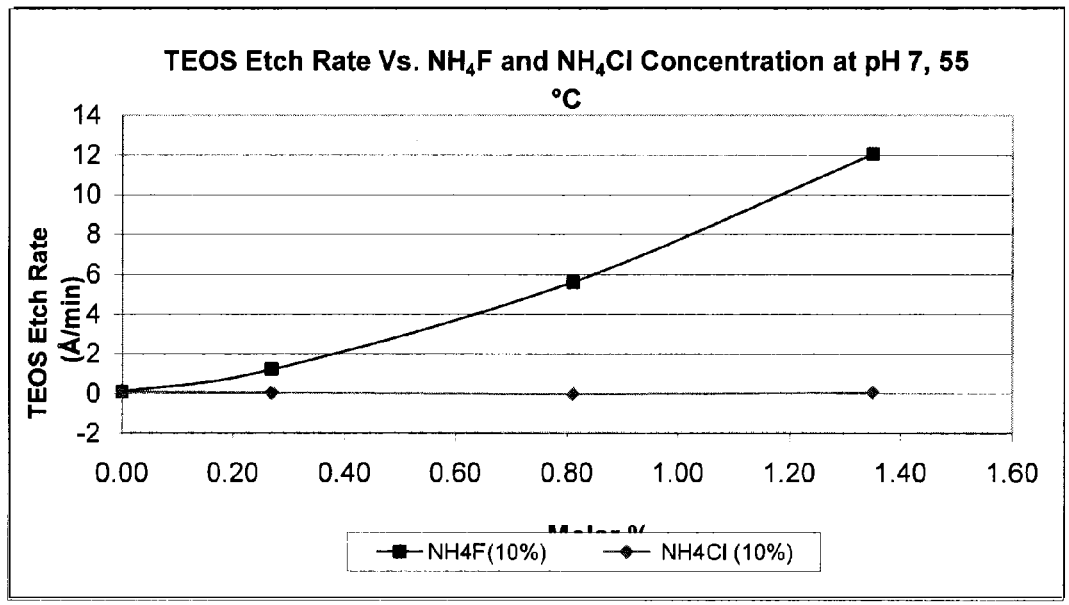
FIG. 20 is a graph of TEOS etch rate vs. $NH_4F$ and $NH_4Cl$ at 55° C. and pH 7.
Figure 21:
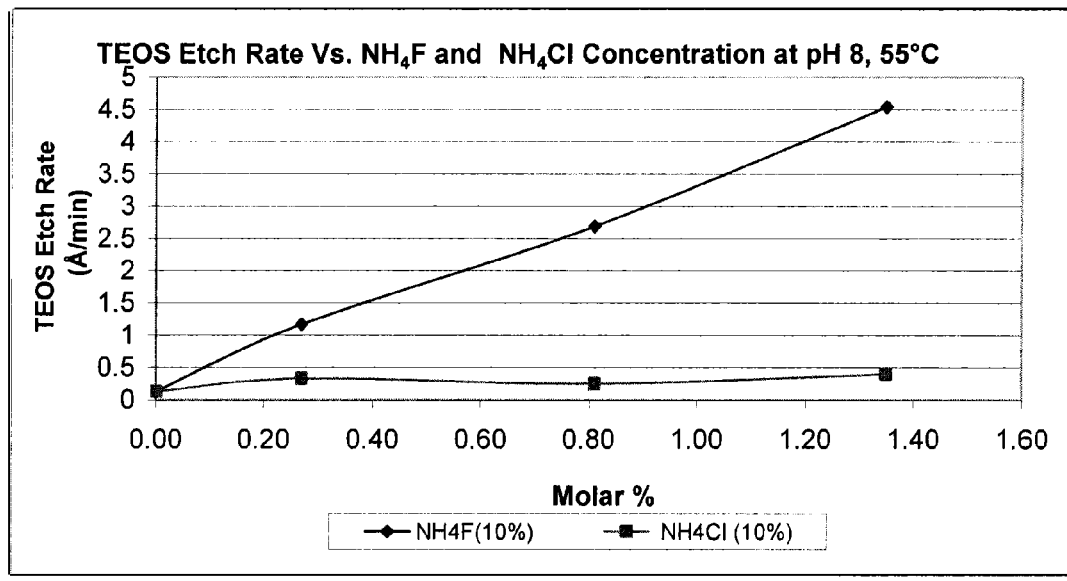
FIG. 21 is a graph of TEOS etch rate vs. $NH_4F$ and $NH_4Cl$ at 55° C. and pH 8.

TEOS etch rate results are shown graphically in FIGS. 15 and 16 where it can be seen that with the inclusion of NH₄Cl or NH₄Br the etch rate for TEOS remains insignificant as the concentration of halide anion increases from 0 to 5 wt %. In contrast, the TEOS etch rate increases as the concentration of NH₄F increases from 0 to 5 wt %. The results indicate that compositions which contain halide anion Cl⁻ or Br⁻ do not etch TEOS. Low-k materials consist of porous TEOS, and this result indicates that the formulations with NH₄Br (or NH₄Cl) are compatible with low-k materials.

Cleaning Performance

Wafers were processed as described above, and the cleaning performance results are shown in FIG. 17 which illustrates that etch residues are satisfactorily removed after chemical treatments at 30° C. for 90 seconds.

The compositions and method according to the inventive concepts described herein have excellent properties and are uniquely capable of selectively etching TiN, TiNxOy or W metal hardmasks, are compatible with Cu and low-k dielectric materials, and can also simultaneously remove copper oxide, polymeric materials and etch residues from the substrate being treated.

Formulations and Their Performance

The formulations below are designed for all applications where corrosion of copper components during semiconductor device manufacture is not a concern, and formulations prepared according to the inventive concepts described herein do not contain a corrosion inhibitor.

The compositions shown in Tables 7A and 7B were prepared and TEOS etch rate evaluations were carried out as described above at a temperature of 55° C. Table 7A shows TEOS etch rate data measured at pH=7, while Table 7B shows TEOS etch rate data measured at pH=8. The measured TEOS etch rates are summarized in Tables 7A and 7B and are shown graphically in FIGS. 18-21. It is seen from these graphs that the TEOS etch rate is not impacted by the level of either of the ammonium bromide or ammonium chloride level, but etch rate increases with increasing ammonium fluoride level.

Figure 22:
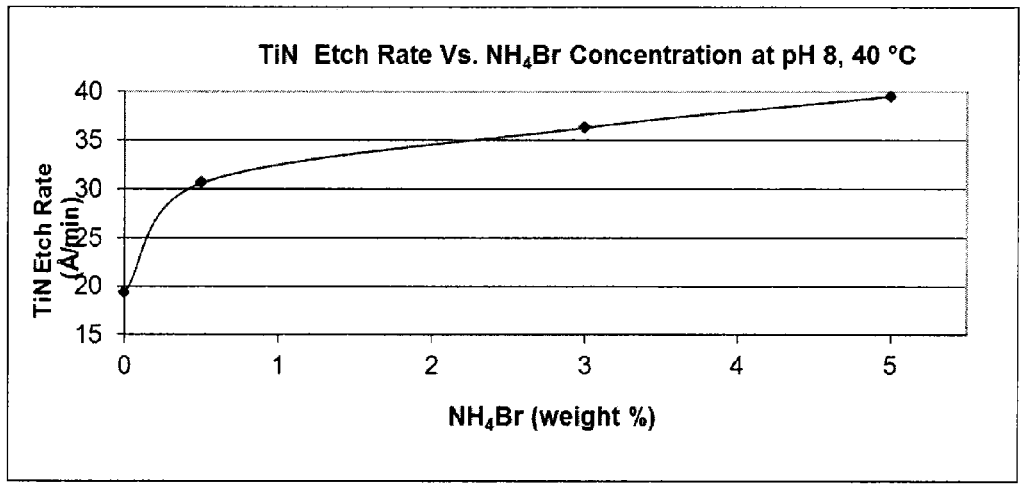
FIG. 22 is a graph of TiN etch rate vs. $NH_4Br$ at 40° C. and pH 8.
Figure 23:
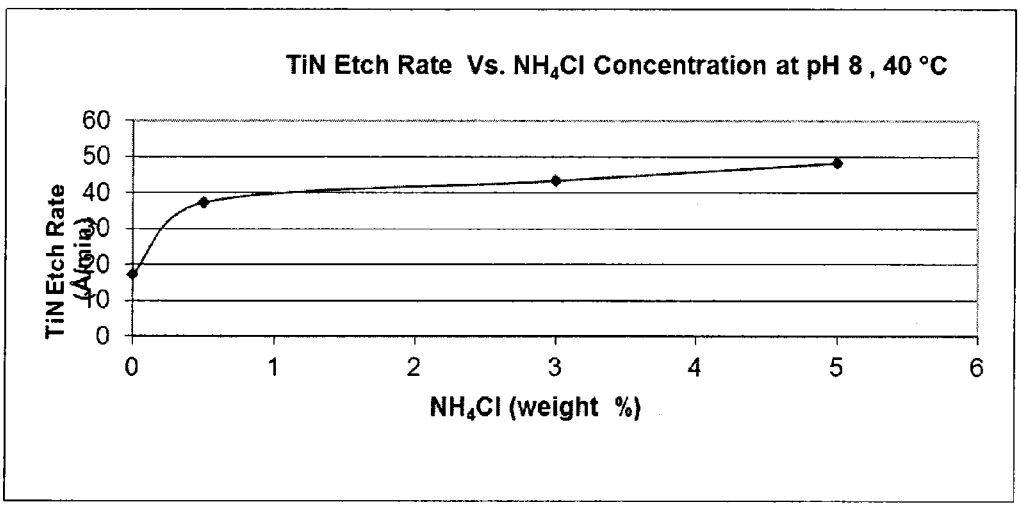
FIG. 23 is a graph of TiN etch rate vs. $NH_4Cl$ at 40° C. and pH 8.

The compositions shown in Tables 7C and 7D were prepared and TiN etch rate evaluations were carried out as described above at a temperature of 40° C. Table 7C shows TiN etch rate data measured at pH=7, while Table 7D shows TiN etch rate data measured at pH=8. The measured TiN etch rates are summarized in Tables 7C and 7D and are shown graphically in FIGS. 22-23. It is seen from these graphs that the TiN etch rate increases with increasing levels of ammonium bromide, ammonium chloride, and ammonium fluoride.

TABLE 7A

TEOS Etch Rate at pH 7, 55° C.

| Formulation | NH4Br (10%) | NH4F (10%) | NH4Cl (10%) | DGA (10%) | DI balance | H2O2 (30%) | pH | TEOS (55° C.) Etch Rate (Å/min) |
|---|---|---|---|---|---|---|---|---|
| HCX33-F0-7   | 0     | 0  | 0    | 0.023 | 80 | 20 | 7 | 0.09   |
| HCX33-F10-7  | 0     | 10 | 0    | 0.027 | 80 | 20 | 7 | 1.22   |
| HCX33-F30-7  | 0     | 30 | 0    | 0.000 | 80 | 20 | 7 | 5.61   |
| HCX33-F50-7  | 0     | 50 | 0    | 0.000 | 80 | 20 | 7 | 12.06  |
| HCX33-Br10-7 | 31.6  | 0  | 0    | 0.206 | 80 | 20 | 7 | 0.20   |
| HCX33-Br30-7 | 94.7  | 0  | 0    | 0.532 | 80 | 20 | 7 | 0.19   |
| HCX33-Br50-7 | 157.8 | 0  | 0    | 0.844 | 80 | 20 | 7 | 0.19   |
| HCX33-Cl10-7 | 0     | 0  | 14.4 | 0.136 | 80 | 20 | 7 | 0.06   |
| HCX33-Cl30-7 | 0     | 0  | 43.3 | 0.327 | 80 | 20 | 7 | −0.01  |
| HCX33-Cl50-7 | 0     | 0  | 72.2 | 0.461 | 80 | 20 | 7 | 0.07   |

*Formulations with Br and Cl in the designated name contain NH$_4$Br and NH$_4$Cl, respectively.

TABLE 7B

TEOS Etch Rate at pH 8, 55° C.

| Formulation | NH4Br (10%) | NH4F (10%) | NH4Cl (10%) | DGA (10%) | DI balance | H2O2 (30%) | pH | TEOS (55° C.) Etch Rate (Å/min) |
|---|---|---|---|---|---|---|---|---|
| HCX33-F0-8   | 0     | 0  | 0    | 0.017 | 80 | 20 | 8 | 0.13 |
| HCX33-F10-8  | 0     | 10 | 0    | 0.100 | 80 | 20 | 8 | 1.17 |
| HCX33-F30-8  | 0     | 30 | 0    | 0.204 | 80 | 20 | 8 | 2.69 |
| HCX33-F50-8  | 0     | 50 | 0    | 0.294 | 80 | 20 | 8 | 4.54 |
| HCX33-Br10-8 | 31.6  | 0  | 0    | 0.179 | 80 | 20 | 8 | 0.67 |
| HCX33-Br30-8 | 94.7  | 0  | 0    | 0.417 | 80 | 20 | 8 | 0.79 |
| HCX33-Br50-8 | 157.8 | 0  | 0    | 0.672 | 80 | 20 | 8 | 0.93 |
| HCX33-Cl10-8 | 0     | 0  | 14.4 | 0.124 | 80 | 20 | 8 | 0.33 |
| HCX33-Cl30-8 | 0     | 0  | 43.3 | 0.295 | 80 | 20 | 8 | 0.25 |
| HCX33-Cl50-8 | 0     | 0  | 72.2 | 0.431 | 80 | 20 | 8 | 0.40 |

*Formulations with Br and Cl in the designated name contain NH$_4$Br and NH$_4$Cl, respectively.

TABLE 7C

TiN Etch Rate at pH 7, 40° C.

| Formulation | NH4Br (10%) | NH4Cl (10%) | DGA (10%) | DI balance | H2O2 (30%) | pH | TiN (40° C.) Etch Rate (Å/min) |
|---|---|---|---|---|---|---|---|
| HCX33-Br0-7  | 0   | 0   | 0.036 | 80 | 20 | 7 | 8.59  |
| HCX33-Br05-7 | 0.5 | 0   | 0.037 | 80 | 20 | 7 | 15.88 |
| HCX33-Br3-7  | 3   | 0   | 0.052 | 80 | 20 | 7 | 21.11 |
| HCX33-Br5-7  | 5   | 0   | 0.071 | 80 | 20 | 7 | 24.41 |
| HCX33-Cl0-7  | 0   | 0   | 0.038 | 80 | 20 | 7 | 9.87  |
| HCX33-Cl05-7 | 0   | 0.5 | 0.041 | 80 | 20 | 7 | 18.89 |
| HCX33-Cl3-7  | 0   | 3   | 0.066 | 80 | 20 | 7 | 24.96 |
| HCX33-Cl5-7  | 0   | 5   | 0.084 | 80 | 20 | 7 | 25.93 |

*Formulations with Br and Cl in the designated name contain NH$_4$Br and NH$_4$Cl, respectively.

TABLE 7D

| | TiN Etch Rate at pH 8, 40° C. | | | | | | |
|---|---|---|---|---|---|---|---|
| | Component | | | | | | TiN (40° C.) |
| Formulation | NH4Br (10%) | NH4Cl (10%) | DGA (10%) | DI balance | H2O2 (30%) | pH | Etch Rate (Å/min) |
| HCX33-Br0-8 | 0 | 0 | 0.134 | 80 | 20 | 8 | 19.30 |
| HCX33-Br05-8 | 0.5 | 0 | 0.207 | 80 | 20 | 8 | 30.59 |
| HCX33-Br3-8 | 3 | 0 | 0.335 | 80 | 20 | 8 | 36.28 |
| HCX33-Br5-8 | 5 | 0 | 0.470 | 80 | 20 | 8 | 39.52 |
| HCX33-Cl0-8 | 0 | 0 | 0.116 | 80 | 20 | 8 | 17.09 |
| HCX33-Cl05-8 | 0 | 0.5 | 0.265 | 80 | 20 | 8 | 37.24 |
| HCX33-Cl3-8 | 0 | 3 | 0.593 | 80 | 20 | 8 | 43.26 |
| HCX33-Cl5-8 | 0 | 5 | 0.742 | 80 | 20 | 8 | 48.2 |

*Formulations with Br and Cl in the designated name contain $NH_4Br$ and $NH_4Cl$, respectively.

What is claimed is:

1. A semiconductor processing composition which is effective for removing photoresist, polymeric materials, etching residues and copper oxide from a substrate in the absence of a Cu corrosion inhibitor, wherein the substrate includes copper, low-k dielectric material and a hardmask selected from TiN or TiNxOy, the composition comprising water, at least one halide anion selected from NH4Br, at least one oxidizing agent, and a base for adjusting pH.

2. The composition of claim 1 further comprising an organic cosolvent that miscible with water.

3. A semiconductor processing composition which is effective for removing photoresist, polymeric materials, etching residues and copper oxide from a substrate in the absence of a Cu corrosion inhibitor, wherein the substrate includes copper, low-k dielectric material and a metal hardmask which is W, the composition comprising water, at least one halide anion selected from NH4Br, at least one oxidizing agent, and a base for adjusting pH.

4. The composition of claim 1 further comprising an organic cosolvent that is miscible with water.

5. The semiconductor processing composition of claim 1 wherein the oxidizing agent is selected from the group consisting of hydrogen peroxide, ozone, ferric chloride, permanganate, peroxoborate, perchlorate, persulfate, ammonium peroxydisulfate, peracetic acid, urea hydroperoxide, percarbonate, perborate, and mixtures thereof.

6. The semiconductor processing composition of claim 3 wherein the oxidizing agent is selected from the group consisting of hydrogen peroxide, ozone, ferric chloride, permanganate, peroxoborate, perchlorate, persulfate, ammonium peroxydisulfate, peracetic acid, urea hydroperoxide, percarbonate, perborate, and mixtures thereof.

* * * * *